US008222680B2

(12) United States Patent
Lin et al.

(10) Patent No.: US 8,222,680 B2
(45) Date of Patent: Jul. 17, 2012

(54) DOUBLE AND TRIPLE GATE MOSFET DEVICES AND METHODS FOR MAKING SAME

(75) Inventors: Ming-Ren Lin, Cupertino, CA (US); Judy Xilin An, San Jose, CA (US); Zoran Krivokapic, Santa Clara, CA (US); Cyrus E. Tabery, Sunnyvale, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 959 days.

(21) Appl. No.: 10/274,961

(22) Filed: Oct. 22, 2002

(65) Prior Publication Data

US 2004/0075122 A1    Apr. 22, 2004

(51) Int. Cl.
*H01L 29/72* (2006.01)
(52) U.S. Cl. ......... 257/288; 257/315; 257/368; 257/401
(58) Field of Classification Search ................. 257/288, 257/289, 291, 316, 317, 188, 315, 368, 401
See application file for complete search history.

(56) References Cited

U.S. PATENT DOCUMENTS

| 4,979,014 | A | 12/1990 | Hieda et al. ...................... 357/56 |
| 6,342,410 | B1 * | 1/2002 | Yu ................................. 438/164 |
| 6,359,311 | B1 | 3/2002 | Colinge et al. ................. 257/347 |
| 6,413,802 | B1 * | 7/2002 | Hu et al. ......................... 438/151 |
| 6,433,609 | B1 | 8/2002 | Voldman ........................ 327/313 |
| 6,525,403 | B2 * | 2/2003 | Inaba et al. ..................... 257/618 |
| 6,657,252 | B2 | 12/2003 | Fried et al. ..................... 257/316 |
| 6,812,119 | B1 | 11/2004 | Ahmed et al. ................. 438/585 |
| 2002/0003255 | A1 * | 1/2002 | Usuki et al. .................... 257/316 |
| 2002/0125536 | A1 * | 9/2002 | Iwasa et al. .................... 257/368 |
| 2002/0153587 | A1 | 10/2002 | Adkisson et al. ............. 257/510 |
| 2002/0177263 | A1 | 11/2002 | Hanafi et al. .................. 438/183 |
| 2003/0042531 | A1 * | 3/2003 | Lee et al. ....................... 257/288 |
| 2003/0113970 | A1 | 6/2003 | Fried et al. |
| 2004/0075121 | A1 | 4/2004 | Yu et al. ......................... 257/288 |
| 2004/0110331 | A1 | 6/2004 | Yeo et al. ....................... 438/100 |
| 2004/0195628 | A1 * | 10/2004 | Wu et al. ........................ 257/351 |
| 2005/0020020 | A1 * | 1/2005 | Collaert et al. ............... 438/300 |

FOREIGN PATENT DOCUMENTS

EP    0 623 963 A1    11/1994
(Continued)

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner* — Edward Wojciechowicz
(74) *Attorney, Agent, or Firm* — Harrity & Harrity, LLP

(57) ABSTRACT

A double gate metal-oxide semiconductor field-effect transistor (MOSFET) includes a fin, a first gate and a second gate. The first gate is formed on top of the fin. The second gate surrounds the fin and the first gate. In another implementation, a triple gate MOSFET includes a fin, a first gate, a second gate, and a third gate. The first gate is formed on top of the fin. The second gate is formed adjacent the fin. The third gate is formed adjacent the fin and opposite the second gate.

15 Claims, 12 Drawing Sheets

FOREIGN PATENT DOCUMENTS

| JP | 03-250770 A | 11/1991 |
|----|-------------|---------|
| JP | 07-050421 A | 2/1995 |
| JP | 08-204191 A | 8/1996 |
| JP | 09-275151 A | 10/1997 |
| WO | WO 01/69689 | 9/2001 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

U.S. Appl. No. 10/348,758, filed Jan. 23, 2003; Pradeep Sindhu et al.; Germanium MOSFET Devices and Methods for Making Same; 49 pages.

U.S. Appl. No. 10/348,911, filed Jan. 23, 2003; Raymond M. Lim et al.; Tri-Gate and Gate Around MOSFET Devices and Methods for Making Same; 35 pages.

Jong-Tae Park et al.: "Multiple-Gate SOI MOSFETs: Device Design Guidelines," *IEEE Transactions on Electron Devices*, vol. 49, No. 12, Dec. 2002, pp. 2222-2229.

Fu-Liang Yang et al.: "25 nm CMOS Omega FETs," International Electron Devices Meeting 2002, IEDM, Technical Digest, Dec. 8-11, 2002 in New York, NY, pp. 255-258.

Toshikazu Mukaiyama et al.: "Fabrication of Gate-All-Around MOSFET by Silicon Anisotropic Etching Technique," *Solid State Electronics*, Elsevier Science Publishers, vol. 42, No. 7-8, Jul. 8, 1998, pp. 1623-1626.

Yang-Kyu Choi et al.: "Spacer FinFET: nanoscale double-gate CMOS technology for the terabit era," *Solid State Electronics*, Elsevier Science Publishers, vol. 46, No. 10, Oct. 2002, pp. 1595-1601.

Effendi Leobandung et al.: "Wire-channel and wrap-around-gate metal-oxide-semiconductor field-effect transistors with a significant reduction of short channel effects," 41$^{st}$ International Conference on Electron, Ion, and Photon Beams Technology and Nanofabrication in Dana Point, CA, May 27-30, 1997, vol. 15, No. 6, *Journal of Vacuum Science & Technology B* (Microelectronics and Nanometer Structures), Nov.-Dec. 1997, AIP for American Vacuum Soc., pp. 2791-2794.

PCT International Search Report mailed Jul. 13, 2004, 5 pages.

U.S. Appl. No. 10/653,105, filed Sep. 3, 2003; Bin Yu et al.; Additional Gate Control for a Double-Gate MOSFET; 27 pages.

U.S. Appl. No. 10/348,758, filed Jan. 23, 2003; Judy Xilin An et al.; Germanium MOSFET Devices and Methods for Making Same; 49 pages.

U.S. Appl. No. 10/348,911, filed Jan. 23, 2003; Judy Xilin An et al.; Tri-Gate and Gate Around MOSFET Devices and Methods for Making Same; 35 pages.

\* cited by examiner

DOUBLE AND TRIPLE GATE MOSFET DEVICES AND METHODS FOR MAKING SAME

FIELD OF THE INVENTION

The present invention relates generally to semiconductor manufacturing and, more particularly, to double and triple gate metal-oxide semiconductor field-effect transistor (MOSFET) devices and methods of making these devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices beyond the 0.1 μm process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is a recent double-gate structure that includes a channel formed in a vertical fin controlled by a self-aligned double gate. The fin may be made thin enough such that the two gates can together control the entire fully depleted channel. Although a double-gate structure, the FinFET is similar to existing planar MOSFET in layout and fabrication techniques. The FinFET also provides a range of channel lengths, CMOS compatibility, and large packing density compared to other double-gate structures.

SUMMARY OF THE INVENTION

Implementations consistent with the principles of the invention provide double gate and triple gate FinFET devices. Unlike conventional designs, each of the gates in the FinFET can independently control the FinFET's channel.

In accordance with the purpose of this invention as embodied and broadly described herein, a method for forming gates in a MOSFET includes forming a fin structure, forming a first gate structure on top of the fin structure, and forming a second gate structure that surrounds the fin structure and the first gate structure.

In another implementation consistent with the present invention, a method for forming gates in a MOSFET includes forming a fin, forming a first gate on top of the fin, forming a second gate that surrounds the fin and the first gate, and removing a portion of the second gate to expose the first gate, the removing causing the second gate to be split into separate gate structures.

In yet another implementation consistent with the principles of the invention, a double gate MOSFET is provided. The double gate MOSFET includes a fin, a first gate structure and a second gate structure. The first gate structure is formed on top of the fin. The second gate structure surrounds the fin and the first gate structure.

In a further implementation consistent with the principles of the invention, a triple gate MOSFET is provided. The triple gate MOSFET includes a fin, a first gate structure formed on top of the fin, a second gate structure formed adjacent the fin, and a third gate structure formed adjacent the fin and opposite the second gate structure.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide double gate and triple gate FinFET devices. Unlike conventional designs, each of the gates in the FinFET can independently control the fin channel.

EXEMPLARY PROCESSING

Figure 1:
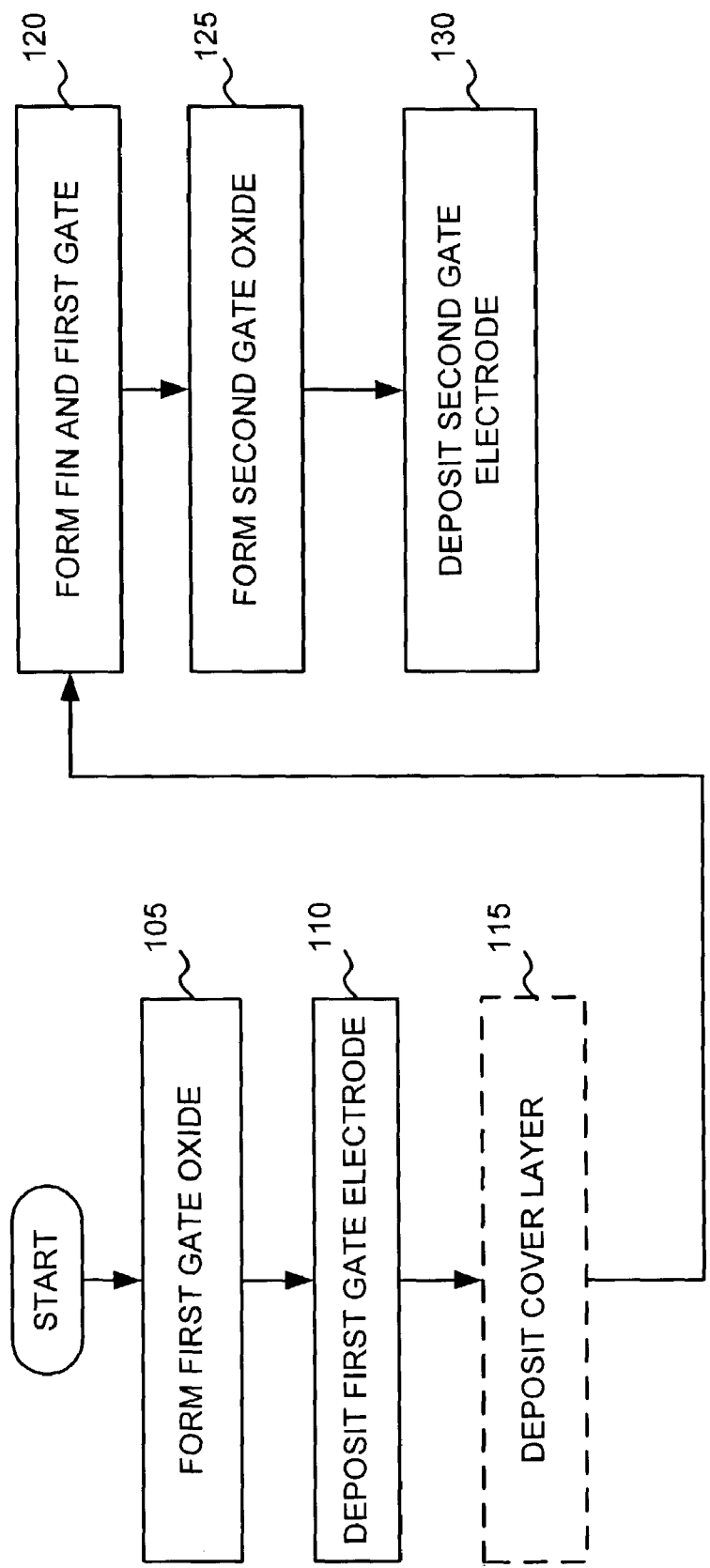
FIG. 1 illustrates an exemplary process for fabricating a double gate MOSFET in an implementation consistent with the principles of the invention.
Figure 2:
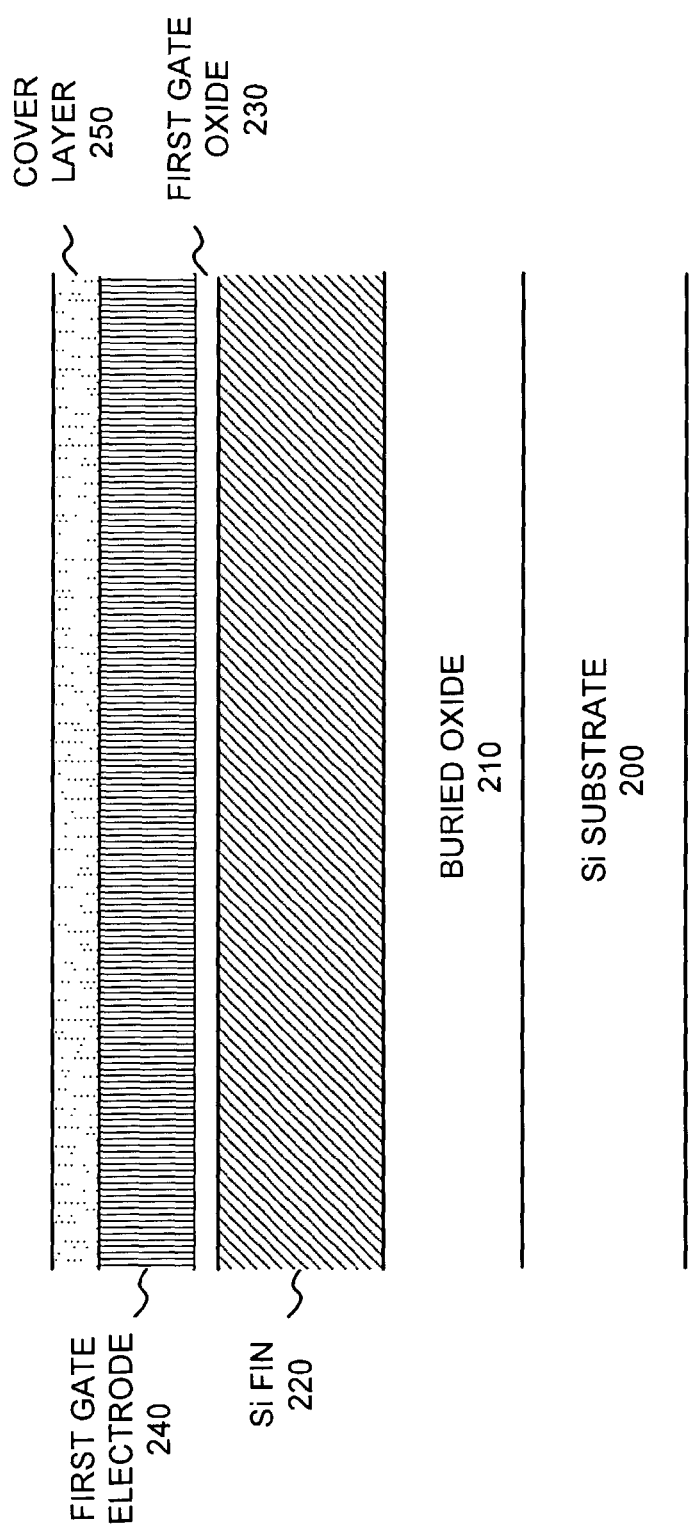
FIGS. 2-4 illustrate exemplary cross-sectional views of a double gate MOSFET fabricated according to the processing described in FIG. 1.
Figure 3:
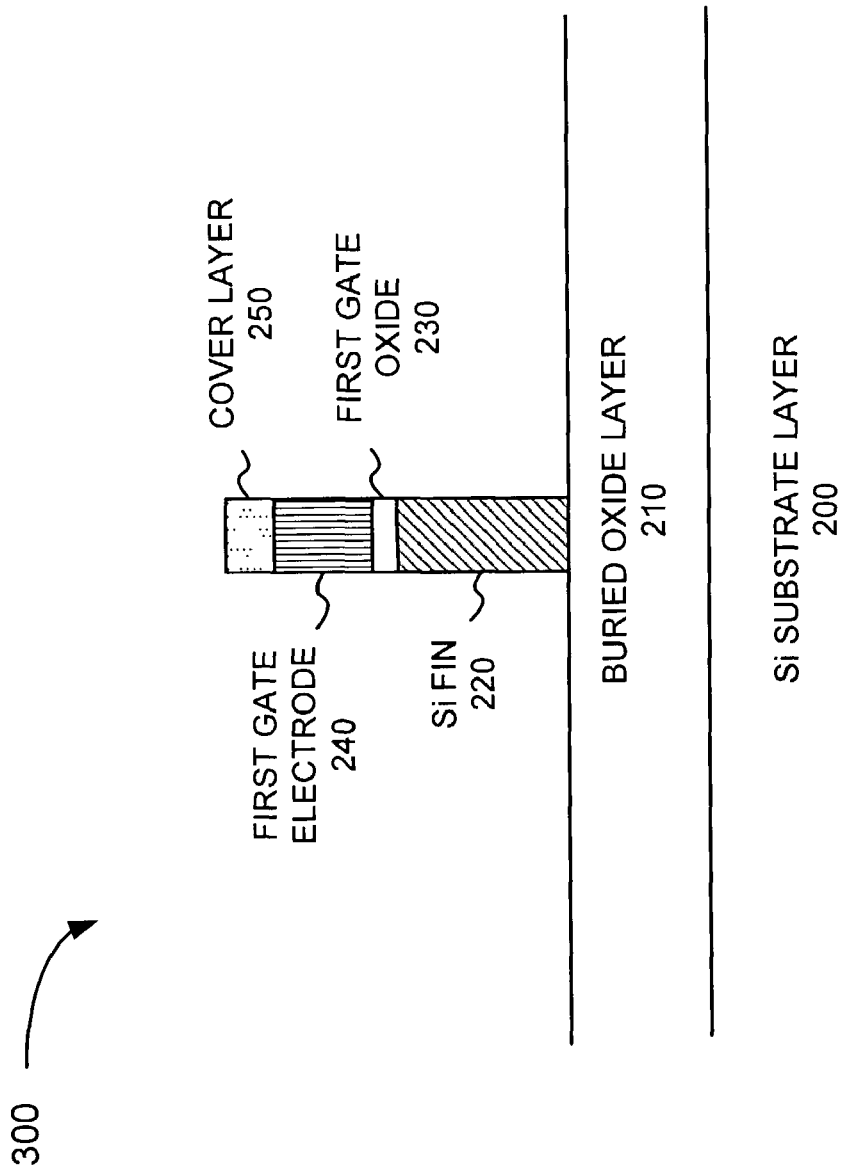
Figure 4:
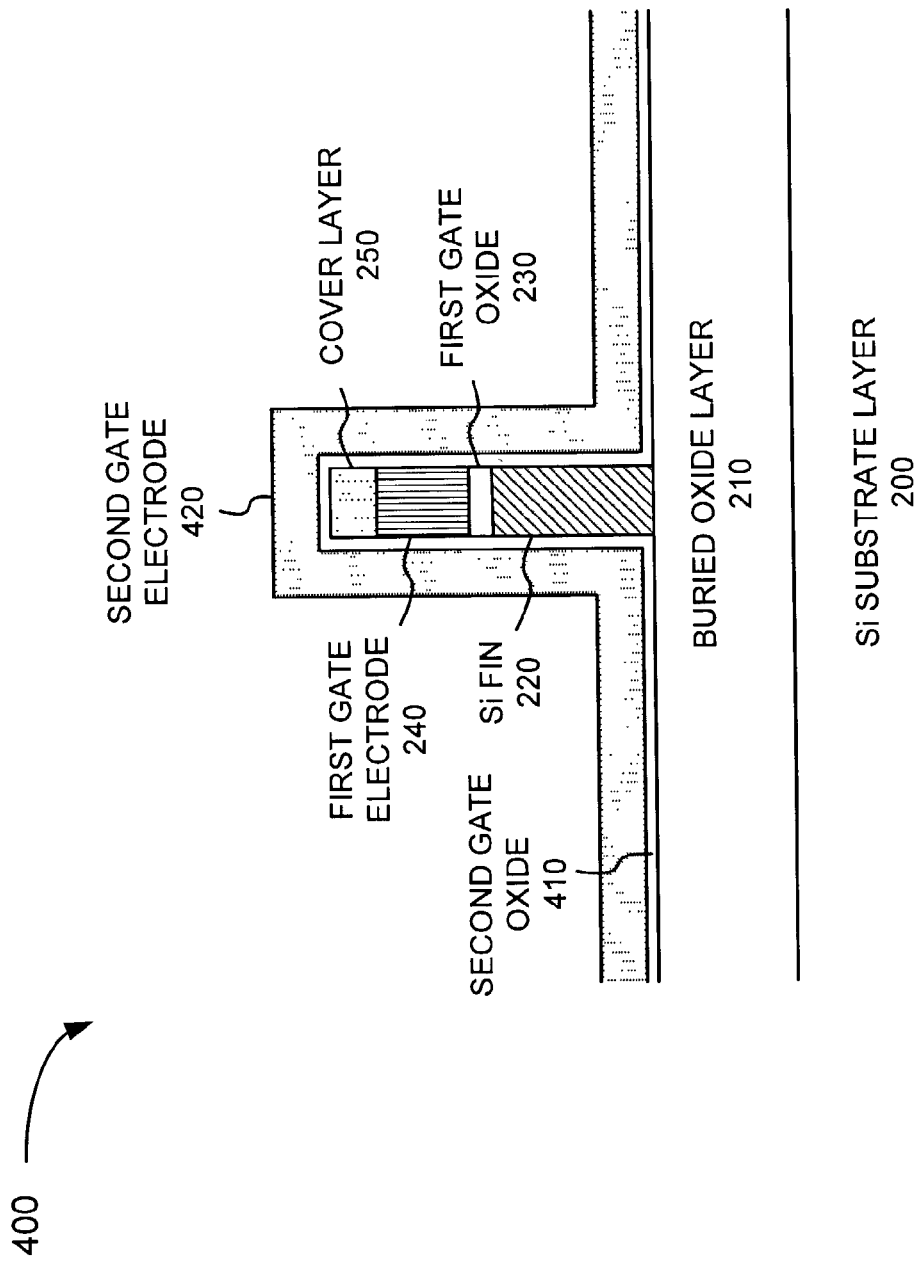

FIG. 1 illustrates an exemplary process for fabricating a double gate MOSFET in an implementation consistent with the principles of the invention. FIGS. 2-4 illustrate exemplary cross-sectional views of a MOSFET fabricated according to the processing described in FIG. 1.

With reference to FIGS. 1 and 2, processing may begin with a silicon on insulator (SOI) structure that includes a silicon substrate 200, a buried oxide layer 210 and a silicon layer 220 on the buried oxide layer 210. Buried oxide layer 210 and silicon layer 220 may be formed on substrate 200 in a conventional manner. The thickness of the buried oxide layer may range, for example, from about 100 Å to 2000 Å. Silicon layer 220 thickness may range from about 200 Å to 1000 Å. It will be appreciated that silicon layer 220 is used to form the fin.

A gate oxide layer 230 may be deposited or thermally grown on silicon layer 220 (act 105). Gate oxide layer 230 may be formed at a thickness ranging from approximately 5 Å to 50 Å. Alternatively, other gate dielectric materials, such as high-K dielectric materials, may be used. In one implementation, nitrided oxide may be used as the gate dielectric material. A gate electrode layer 240 may be deposited over gate oxide layer 230 for forming the first gate (act 110). A number of materials may be used for gate electrode 240. For example, gate electrode 240 may be made from a metal (e.g., tungsten, tantalum, aluminum, nickel, ruthenium, rhodium, palladium, platinum, titanium, molybdenum, etc.), a metal containing a compound (e.g., titanium nitride, tantalum nitride, ruthenium oxide, etc.), or a doped semiconductor (e.g., polycrystalline silicon, polycrystalline silicon-germanium, etc.). A cover layer 250 (or hard mask) may optionally be formed on top of gate electrode 240 to aid in pattern optimization or chemical-mechanical polishing (CMP) (act 115). Cover layer 250 may, for example, include a silicon nitride (SiN) material or some other similar type of material capable of protecting the gate electrode during the fabrication process. Cover layer 250 may be deposited, for example, by chemical vapor deposition (CVD) at a thickness ranging from approximately 30 Å to 200 Å.

Fin 220 and first gate 230/240 may be patterned by conventional lithographic techniques (e.g., electron beam (EB) lithography) (act 120). Fin 220 and first gate 230 may then be etched using well-known etching techniques (act 120). The resulting structure 300 is illustrated in FIG. 3. The width of fin 220 and first gate 230 in structure 300 may be approximately 50 Å to 500 Å.

Following the formation of fin 220 and first gate 230, a second gate may be formed. A second gate oxide layer 410 may be deposited or thermally grown (act 125), as illustrated in FIG. 4. Gate oxide layer 410 may be deposited or grown to a thickness of approximately 5 Å to 50 Å. Alternatively, other gate dielectric materials may be used. For example, any high-K dielectric material may be used as the gate dielectric material. A second gate electrode layer 420 may be deposited over gate oxide layer 410 for forming the second gate (act 130). Similar to first gate electrode 240, a number of materials may be used for second gate electrode 420. As a result, this structure 400 allows two gates (i.e., gates 240 and 420) to independently control the fin channel. Conventional MOSFET fabrication processing can be utilized to complete the transistor (e.g., forming the source and drain regions), contacts, interconnects and inter-level dielectrics for the double gate MOSFET.

Figure 5:
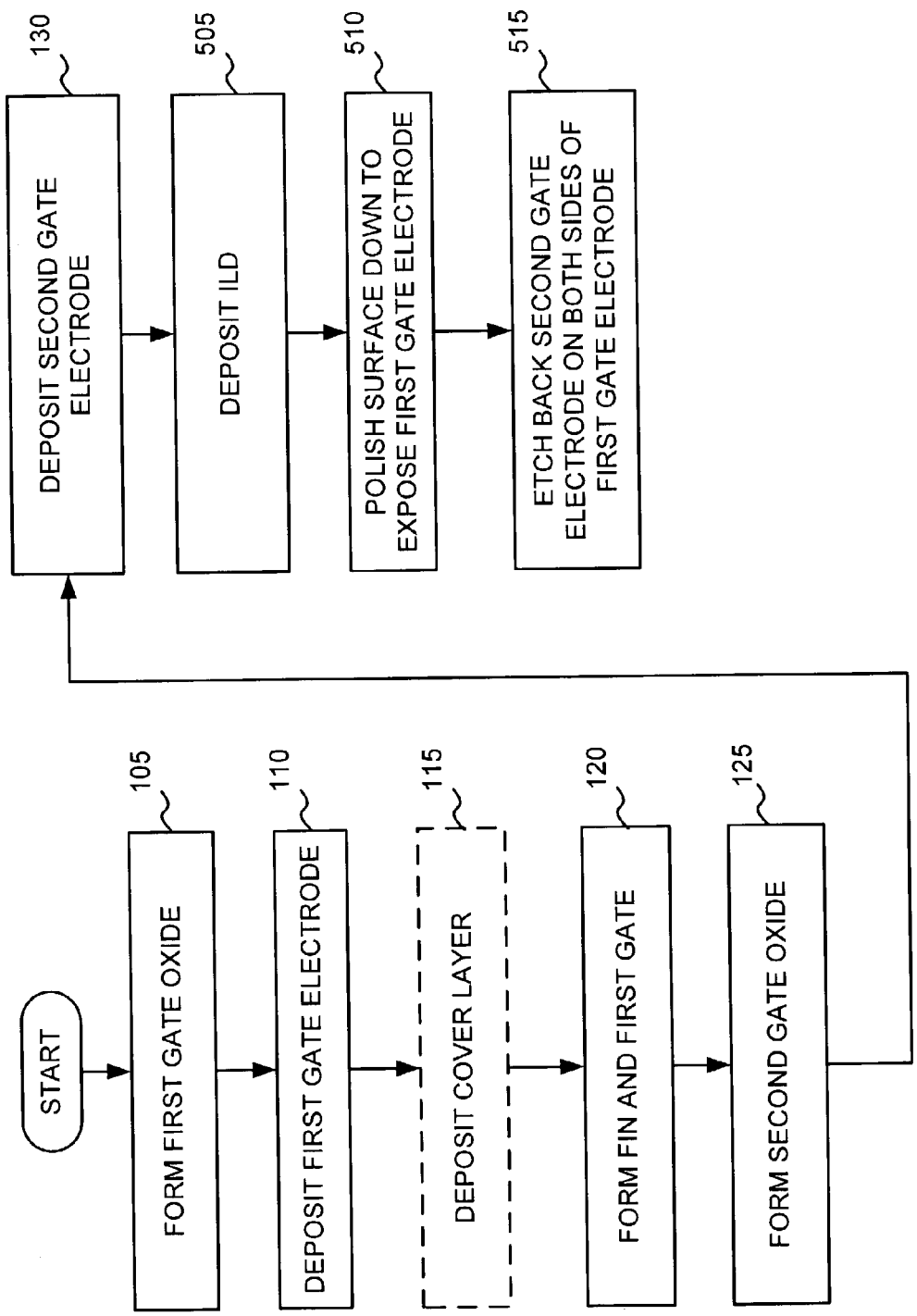
FIG. 5 illustrates an exemplary process for fabricating a triple gate MOSFET in an implementation consistent with the principles of the invention.
Figure 6:
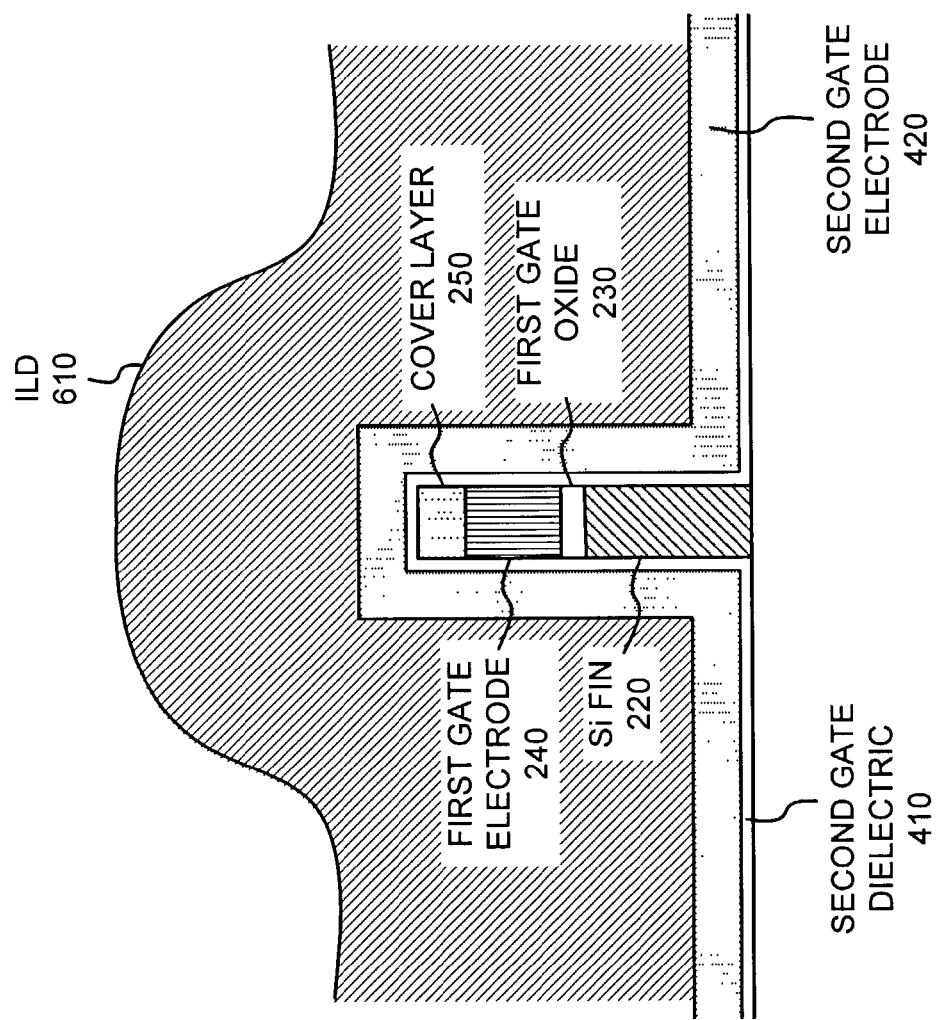
FIGS. 6-8 illustrate exemplary cross-sectional views of a triple gate MOSFET fabricated according to the processing described in FIG. 5.
Figure 7:
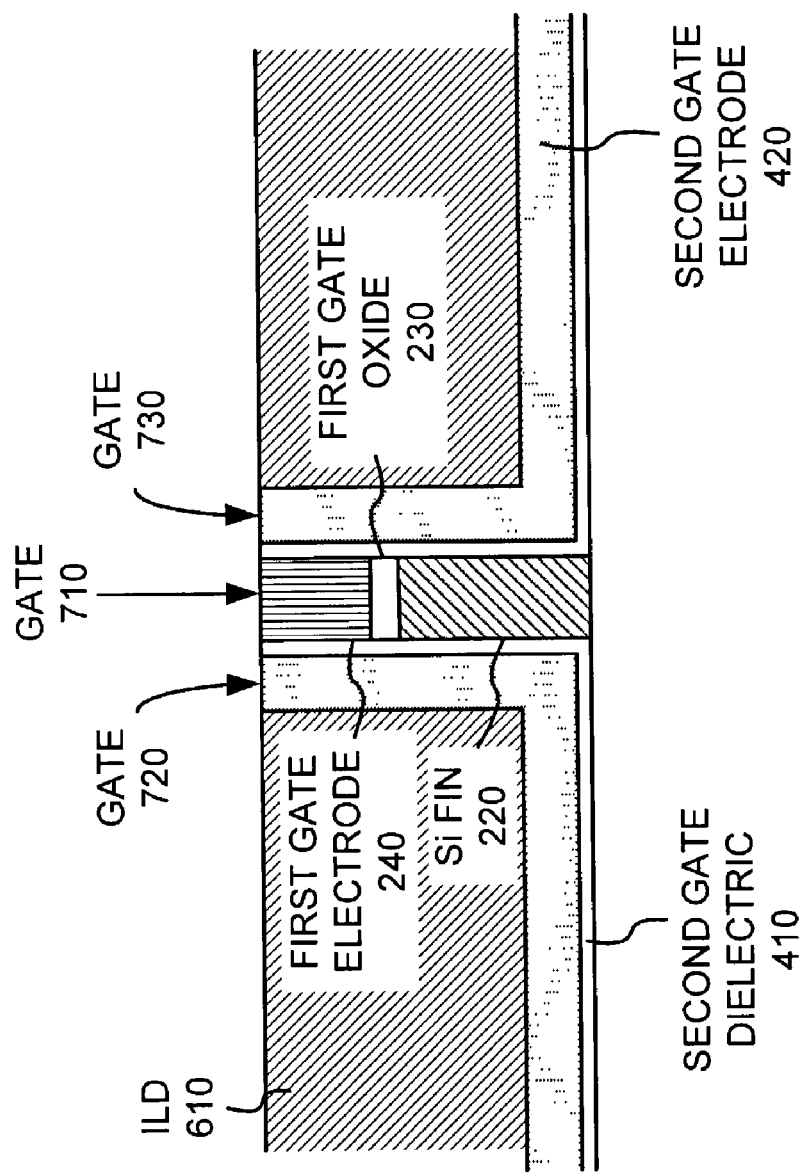
Figure 8:
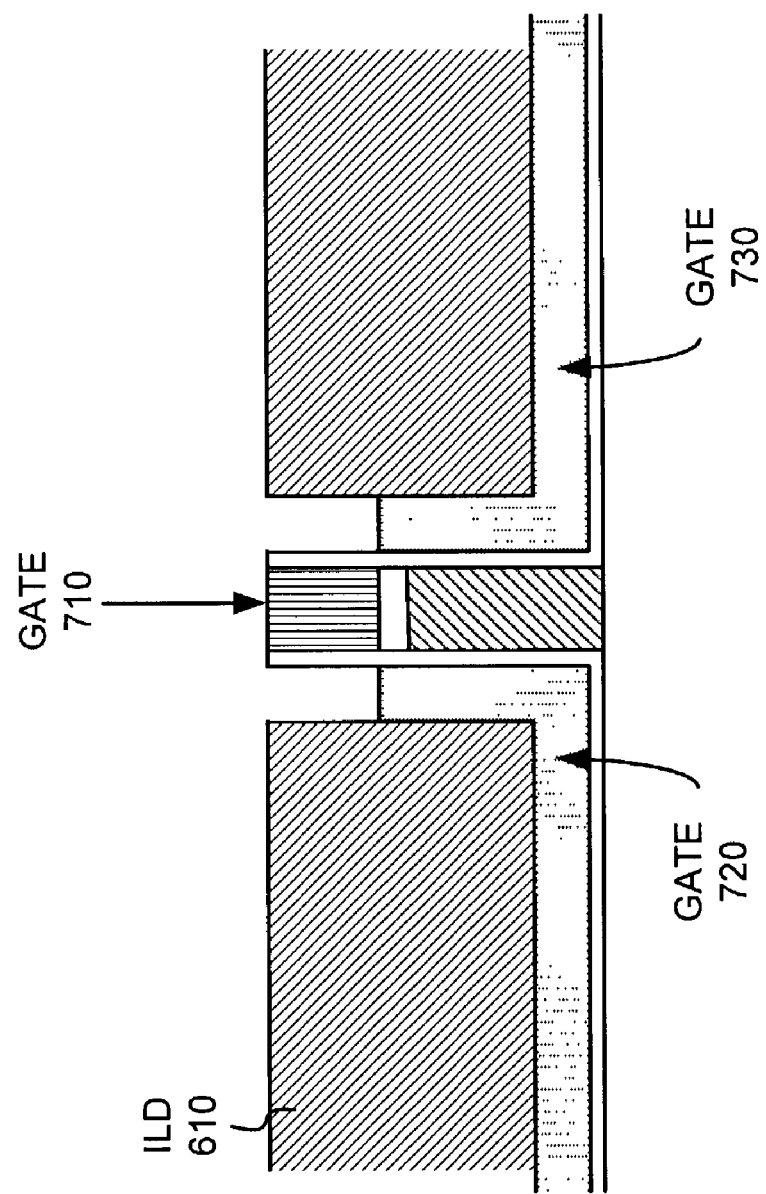

FIG. 5 illustrates an exemplary process for fabricating a triple gate MOSFET in an implementation consistent with the principles of the invention. FIGS. 6-8 illustrate exemplary cross-sectional views of a triple gate MOSFET fabricated according to the processing described in FIG. 5. Processing may begin by performing acts 105-130 described above with respect to FIG. 1. After gate electrode layer 420 has been deposited, an interlayer dielectric (ILD) 610 may be deposited over second gate electrode layer 410 (act 505), as illustrated in FIG. 6. ILD 610 may include, for example, tetraethoxy silane (TEOS) or another similar type of material. The thickness of ILD 610 may be such that it extends above the height of second gate electrode 420.

Chemical-mechanical polishing (CMP) or another comparable technique may then be performed to planarize the wafer surface to expose first gate electrode 240 (act 510), as illustrated in FIG. 7. As a result, second gate electrode 420 may be split to form two separate gate structures, namely gates 720 and 730. Based on this configuration, a triple gate MOSFET may be formed, where the first gate electrode 240 acts as a third gate 710. Gates 710-730 may each independently control fin 220. To reduce capacitive coupling to gate 710, gates 720 and 730 may be etched back (act 515), as illustrated in FIG. 8, using known techniques. Conventional MOSFET fabrication processing can be utilized to complete the transistor (e.g., forming the source and drain regions), contacts, interconnects and inter-level dielectrics for the triple gate MOSFET.

OTHER IMPLEMENTATIONS

Mobility is an important attribute for improving transistor performance. Mobility may be affected by the state of the strain (or stress) in the film. For example, tensile strain is good for electron mobility, while compressive stress may aid hole mobility.

Figure 9:
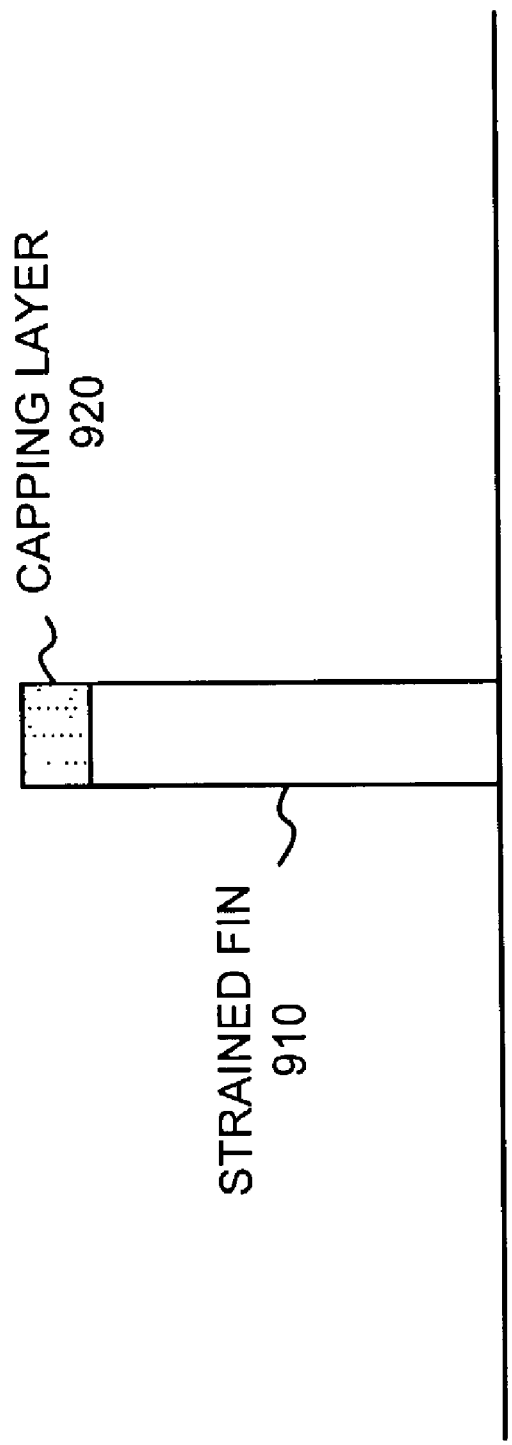
FIG. 9 illustrates an exemplary structure for adding mobility to a fin in an implementation consistent with the principles of the invention.

FIG. 9 illustrates an exemplary structure for adding mobility to a fin. As illustrated, a fin structure 910 may be formed by forming a silicon layer on a semiconductor substrate. In one implementation consistent with the invention, the semiconductor substrate may be a SOI structure including an insulating layer, such as a buried oxide layer, formed at a thickness ranging from 100 Å to 2000 Å. Processing for forming a semiconductor substrate, having a buried oxide layer, is well known in the integrated circuit fabrication arts.

A highly stressed film (referred to hereinafter as a "capping layer") 920 may then be formed on top of fin structure 910. In one implementation, capping layer 920 may be formed from, for example, a nitride-based material at a thickness of approximately 100 Å to 1000 Å. Other materials may alternatively be used. Capping layer 920 remains after fin 910 is etched so that fin 910 is strained to improve mobility.

Figure 10:
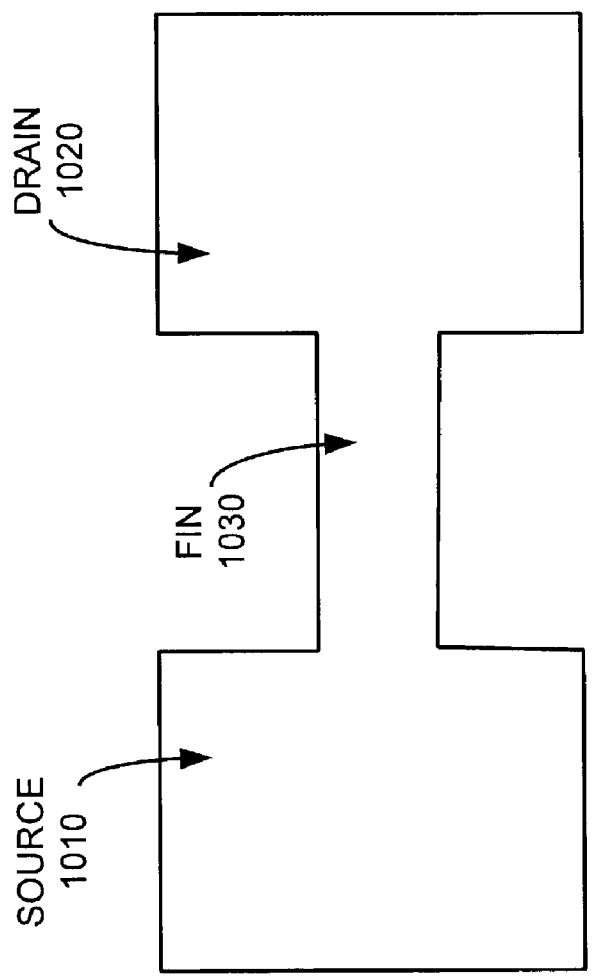
FIGS. 10-12 illustrate exemplary cross-sectional views of a MOSFET fabricated to include a thin fin body structure.
Figure 11:
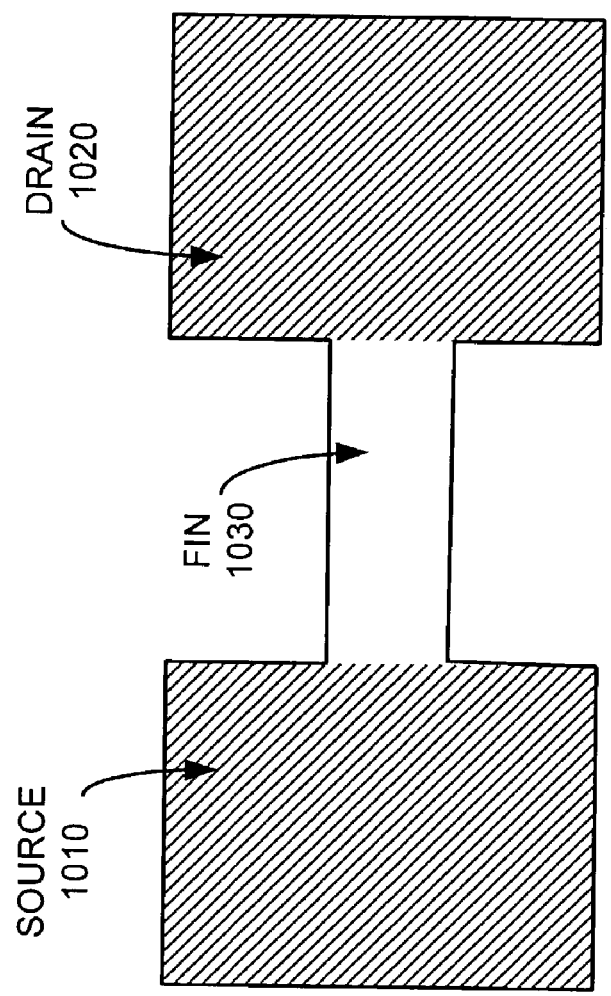
Figure 12:
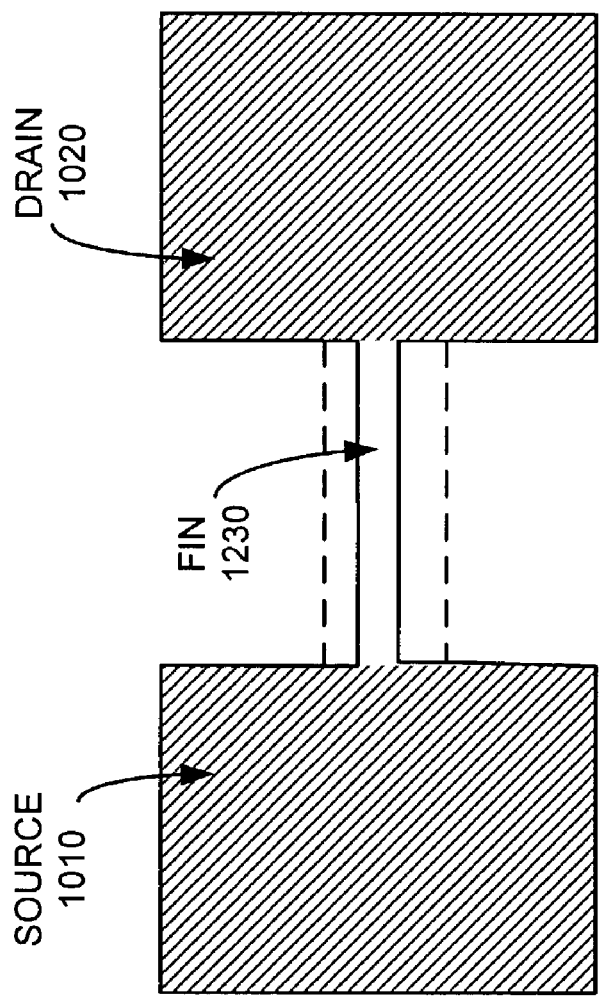

FIGS. 10-12 illustrate exemplary cross-sectional views of a MOSFET fabricated to include a thin fin body structure. As illustrated in FIG. 10, a source region 1010, a drain region 1020, and a fin structure 1030 may be formed via conventional fabrication techniques. For example, an SOI structure may include an insulating layer (e.g., a buried oxide layer) formed on a semiconductor substrate. A silicon film may be formed on the SOI structure. A hard mask (e.g., silicon dioxide) may be deposited on the silicon film. Fin structure 1030 may then be formed via, for example, e-beam lithography and etching. Source and drain regions 1010 and 1020 may then be formed in a similar manner.

Once source region 1010, drain region 1020, and fin structure 1030 have been formed, source region 1010 and drain region 1020 may be covered with a protective mask, as illustrated in FIG. 11. A number of materials may be used for the protective mask, such as a silicon nitride based material. The thickness of the unprotected fin structure 1030 may then be reduced to form a thin fin structure 1230, as illustrated in FIG. 12. This thinning of fin structure 1030 may be accomplished via etching or some other well known technique.

CONCLUSION

Implementations consistent with the principles of the invention provide double gate and triple gate FinFET devices. Unlike conventional designs, each of the gates in the FinFET can independently control the fin channel.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1 and 5, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, used herein, the article "a" is intended to include one or more items. Where only one item is intended, the term "one" or similar language is used.

The scope of the invention is defined by the claims and their equivalents.

What is claimed is:

1. A triple gate metal-oxide semiconductor field-effect transistor (MOSFET), comprising:
   a silicon fin including a left side surface and a right side surface;
   a capping layer formed on top of the fin,
      where the capping layer causes the fin to be strained, and
      where a left side surface of the capping layer is substantially aligned with the left side surface of the fin and a right side surface of the capping layer is substantially aligned with a right side surface of the fin;
   a first gate structure formed on top of the capping layer, a left side surface of the first gate structure being substantially aligned with the left side surface of the capping layer and the left side surface of the silicon fin, and a right side surface of the first gate structure being substantially aligned with the right side surface of the capping layer and the right side surface of the silicon fin;
   a second gate structure formed adjacent the fin; and
   a third gate structure formed adjacent the fin and opposite the second gate structure, the first gate structure, the second gate structure, and the third gate structure being separated from each other.

2. The triple gate MOSFET of claim 1, where the first gate structure, the second gate structure, and the third gate structure are to independently control the fin.

3. The triple gate MOSFET of claim 1, where the second gate structure and the third gate structure include a same gate material.

4. A double gate metal-oxide semiconductor field-effect transistor (MOSFET), comprising:
   a silicon fin including a left side surface and a right side surface;
   a capping layer formed on top of the fin,
      where the capping layer causes the fin to be strained, and
      where a left side surface of the capping layer is substantially aligned with the left side surface of the fin and a right side surface of the capping layer is substantially aligned with a right side surface of the fin;
   a first gate formed on top of the capping layer, a left side surface of the first gate being substantially aligned with the left side surface of the capping layer and the left side surface of the silicon fin, and a right side surface of the first gate being substantially aligned with the right side surface of the capping layer and the right side surface of the silicon fin; and
   a second gate structure that surrounds the fin and the first gate.

5. The double gate MOSFET of claim 4, where the first gate and the second gate are to independently control the fin.

6. The double gate MOSFET of claim 4 further comprising:
   a cover layer and a dielectric layer formed between the first gate and the second gate.

7. The triple gate MOSFET of claim 1, where a width of the silicon fin ranges from approximately 50 Å to 500 Å.

8. The triple gate MOSFET of claim 1, where a thickness of the silicon fin ranges from approximately 200 Å to 1000 Å.

9. The triple gate MOSFET of claim 1, where a top surface of the second gate structure and a top surface of the third gate structure are below a top surface of the first gate structure.

10. The double gate MOSFET of claim 4, where a width of the silicon fin ranges from approximately 50 Å to 500 Å.

11. The double gate MOSFET of claim 4, where a thickness of the silicon fin ranges from approximately 200 Å to 1000 Å.

12. The triple gate MOSFET of claim 1, where the capping layer comprises a stressed film layer.

13. The triple gate MOSFET of claim 1, where the capping layer comprises a nitride-based material.

14. The double gate MOSFET of claim 4, where the capping layer comprises a stressed film layer.

15. The double gate MOSFET of claim 4, where the capping layer comprises a nitride-based material.

* * * * *